(12) United States Patent
Block et al.

(10) Patent No.: US 7,088,158 B2
(45) Date of Patent: Aug. 8, 2006

(54) DIGITAL MULTI-PHASE CLOCK GENERATOR

(75) Inventors: Stefan G. Block, Munich (DE); David R. Reuveni, Taufkirchen (DE)

(73) Assignee: LSI Logic Corporation, Milpitas, CA (US)

( * ) Notice: Subject to any disclaimer, the term of this patent is extended or adjusted under 35 U.S.C. 154(b) by 910 days.

(21) Appl. No.: 10/146,634

(22) Filed: May 14, 2002

(65) Prior Publication Data

US 2003/0215039 A1 Nov. 20, 2003

(51) Int. Cl.
*H03L 7/06* (2006.01)

(52) U.S. Cl. ..................... 327/158; 327/269

(58) Field of Classification Search ............ None
See application file for complete search history.

(56) References Cited

U.S. PATENT DOCUMENTS

| | | | |
|---|---|---|---|
| 5,602,884 A * | 2/1997 | Wieczorkiewicz et al. .. | 375/376 |
| 5,777,501 A | 7/1998 | AbouSeido | |
| 5,945,935 A | 8/1999 | Kusumoto et al. | |
| 6,252,443 B1 | 6/2001 | Dortu et al. | |
| 6,411,142 B1 | 6/2002 | Abbasi et al. | |
| 6,417,713 B1 | 7/2002 | DeRyckere et al. | |
| 6,950,487 B1 * | 9/2005 | Lin et al. ................ | 375/376 |
| 2003/0099321 A1 * | 5/2003 | Juan et al. ................ | 375/376 |
| 2006/0017479 A1 * | 1/2006 | Kim ........................ | 327/158 |

* cited by examiner

*Primary Examiner*—Timothy B. Callahan
*Assistant Examiner*—An T. Luu
(74) *Attorney, Agent, or Firm*—Westman, Champlin, & Kelly

(57) ABSTRACT

A digital multi-phase clock generator includes a reference clock input and first and second digitally-programmable delay lines. The first and second delay lines are coupled in parallel with one another, in series with the reference clock input. Each delay line includes a delay control input. The first delay line has a plurality of phase outputs which are synchronized with the reference clock input and have different phases from one another. The generator further includes a phase detector and a delay control circuit, which are coupled with second delay line to form a phase-locked loop. The delay control circuit has a digital delay control output, which is coupled to the delay control inputs of both the first and second delay lines. The phase-locked loop adjusts delay through the first and second delay lines to lock a phase of an output of the second delay line to a phase of the reference clock input.

18 Claims, 6 Drawing Sheets

US 7,088,158 B2

DIGITAL MULTI-PHASE CLOCK GENERATOR

FIELD OF THE INVENTION

The present invention relates to semiconductor integrated circuits and, more specifically, to a digital multi-phase clock generator.

BACKGROUND OF THE INVENTION

Multi-phase clock generators have been used in semiconductor integrated circuits for a variety of different applications. One common application of a multi-phase clock generator is in telecommunications equipment for capturing data received from high-speed Asynchronous Transfer Mode (ATM) Wide Area Networks (WAN) and Local Area Networks (LAN), for example. The phase of the input data is compared with each available phase output from the clock generator. The phase output that most closely matches the phase of the input data is selected to control latches which acquire the input data.

A typical multi-phase clock generator generates n pairs of clock signals which are equally distributed in phase over 360 degrees. An analog phase-locked loop (PLL) or ring oscillator is typically used to generate the clock signals. While analog PLLs can generate multiple clock signals that are substantially equally distributed in phase, these circuits have several disadvantages. For example if the reference clock input to the PLL stops, the PLL loses phase lock, which must be re-established when the reference clock returns. Also, analog PLL circuits are relatively sensitive to variations in process, voltage and temperature. Analog PLLs can also be fairly difficult to test during design and manufacturing verification.

An alternative to analog multi-phase clock generators is therefore desired, which is capable of maintaining phase lock when the reference clock stops, is easy to test, and is relatively insensitive to changes in process, voltage and temperature.

SUMMARY OF THE INVENTION

One embodiment of the present invention is directed to a digital multi-phase clock generator, which includes a reference clock input and first and second digitally-programmable delay lines. The first and second delay lines are coupled in parallel with one another, in series with the reference clock input. Each delay line includes a delay control input. The first delay line has a plurality of phase outputs which are synchronized with the reference clock input and have different phases from one another. The generator further includes a phase detector and a delay control circuit, which are coupled with second delay line to form a phase-locked loop. The delay control circuit has a digital delay control output, which is coupled to the delay control inputs of both the first and second delay lines. The phase-locked loop adjusts delay through the first and second delay lines to lock a phase of an output of the second delay line to a phase of the reference clock input.

Another embodiment of the present invention is directed to a method of generating a plurality of multi-phase clock outputs. The method includes: a) passing a reference clock through a first digitally-programmable delay line formed of a first plurality of series-connected delay circuits, wherein outputs of the first plurality of delay circuits form the plurality of multi-phase clock outputs; b) passing the reference clock through a second digitally-programmable delay line formed of a second plurality of series-connected delay circuits, wherein an output of a last one of the delay circuits in the second delay line forms a delay feedback output; c) detecting a phase difference between a phase of the delay feedback output and a phase of the reference clock; and d) digitally programming delay through the first and second delay lines as a function of the phase difference.

DETAILED DESCRIPTION OF ILLUSTRATIVE EMBODIMENTS

Figure 1:
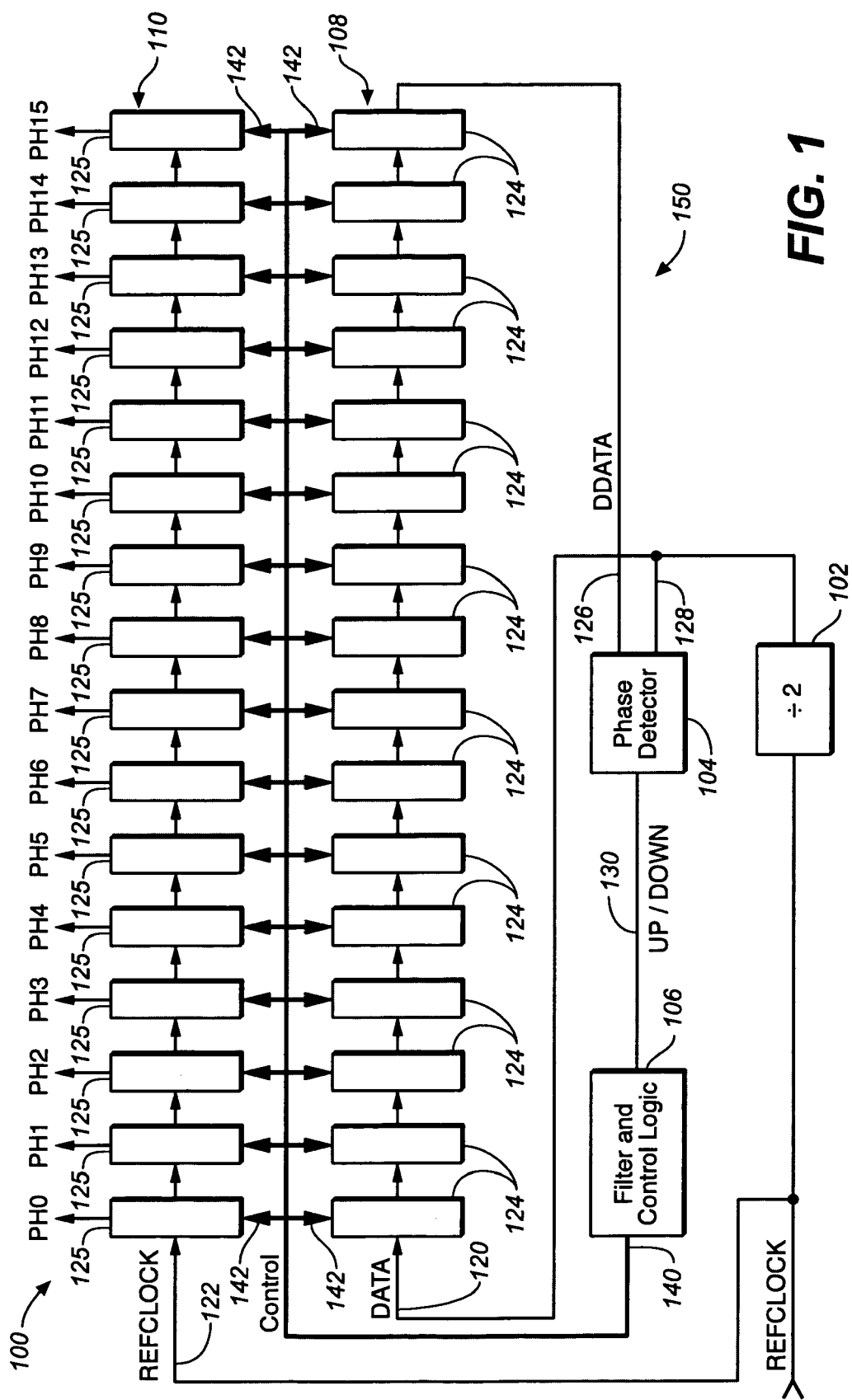
FIG. 1 is a block diagram of a digital multi-phase clock generator according to one embodiment of the present invention.

FIG. 1 is a block diagram of a digital multi-phase clock generator 100 according to one embodiment of the present invention. In the example in shown in FIG. 1, clock generator 100 receives an input reference clock (labeled REFCLOCK) and generates 16 clock outputs (labeled PH0–PH15) which are substantially equally distributed in phase over 360 degrees. In alternative embodiments of the present invention, clock generator 100 can be modified to generate any number of clock phases.

Clock generator 100 includes frequency divider 102, phase detector 104, filter and control logic 106 and parallel, matched delay lines 108 and 110. Frequency divider 102 divides REFCLOCK by two, for example, to provide a 50% duty cycle that eliminates any dependency of clock generator 100 on the duty cycle of REFCLOCK. The divided signal produced by frequency divider 102 is labeled DATA. DATA and REFCLOCK are coupled to inputs 120 and 122, respectively, of parallel delay lines 108 and 110. Each of the parallel delay lines 108 and 110 includes a plurality of matched delay macros 124 and 125, respectively, which are connected in series with one another. In this example there are 16 delay macros 124 and 125 in delay lines 108 and 110. The output of each delay macro 124 and 125 is connected to the input of the next subsequent delay macro 124 and 125 in delay lines 108 and 110. Delay macros 124 and 125 are arranged in pairs. There is one delay macro 124 in delay line 108 for each of the delay macros 125 in delay line 110. Each pair of delay macros 124 and 125 is constructed identically to one another and, in this embodiment, share a common delay control input 142.

Figure 1A:
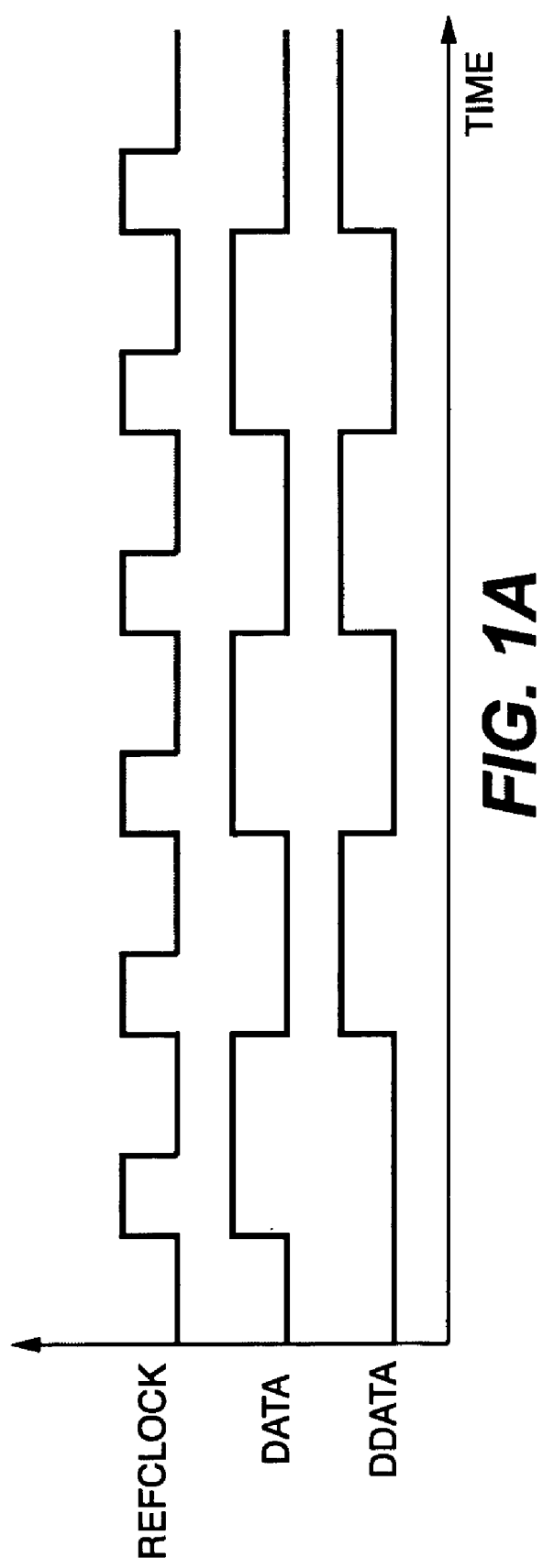
FIG. 1A is a waveform diagram illustrating the waveforms, REFCLOCK, DATA and DDATA, within the generator shown in FIG. 1 over time.

The output of the last delay macro 124 in delay line 108 (labeled "DDATA") is coupled in a feedback loop to feedback input 126 of phase detector 104. FIG. 1A is a waveform diagram illustrating the waveforms REFCLOCK, DATA and DDATA over time. Phase detector 104, filter and control logic 106 and delay line 108 are coupled together to form a digital phase-locked loop (PLL). Phase detector 104 has a reference input 128, which is coupled to the output of frequency divider 102 to receive the non-delayed signal, DATA. Phase detector 104 compares the phase of the falling edge of DATA with the phase of the rising edge of DDATA and responsively generates UP/DOWN phase control signals on phase control output 130. However, any suitable edge can be used for phase detection in alternative embodiments. The UP/DOWN phase control signals are representative of a difference between the phase of DATA relative to the phase of DDATA. Phase control signals UP/DOWN can have any suitable format and can have any suitable number of bits, such as one bit.

In one embodiment, phase detector 104 applies a logic HIGH signal on phase output 130 when the phase of the DDATA lags the phase of DATA to indicate that the phase of DDATA should be advanced. Similarly, phase detector 104 provides a logical LOW signal on phase output 130 when the phase of DDATA leads the phase DATA to indicate that the phase of DDATA should be delayed. For example if DDATA is still LOW at the rising edge of DATA, delay line 108 is too long and must be shortened. If DDATA is already HIGH at the rising edge of DATA, delay line 108 is too short and must be extended. Delay line 108 has the correct delay when the rising edge of DATA coincides with the falling edge of DDATA.

Filter and control logic 106 receives the UP/DOWN phase control signals from phase control output 130 which, when suitably filtered, are used to control the delay settings of the delay macros 124 and 125 within the delay lines 108 and 110. Filter and control logic 106 has a control output bus 140, which is labeled CONTROL and is coupled to the control inputs 142 of delay macros 124 and 125. Control output bus 140 is a multi-bit control bus having a first set of bits defining a main delay setting value and a second set of bits defining respective incremental delay setting values for each pair of delay macros 124 and 125. The main delay setting value is applied in parallel to all delay macros 124 and 125. Each incremental delay setting value is applied individually to its respective pair of matched delay macros 124 and 125 to permit a fine adjustment of the total delay through each line. For example, the control output bus 140 can have three bits for defining the main delay setting value, and one bit for each pair of matched delay macros 124 and 125 for defining the incremental delay setting value for that pair. In this embodiment, control output bus 140 has a total of 19 bits.

Figure 2:
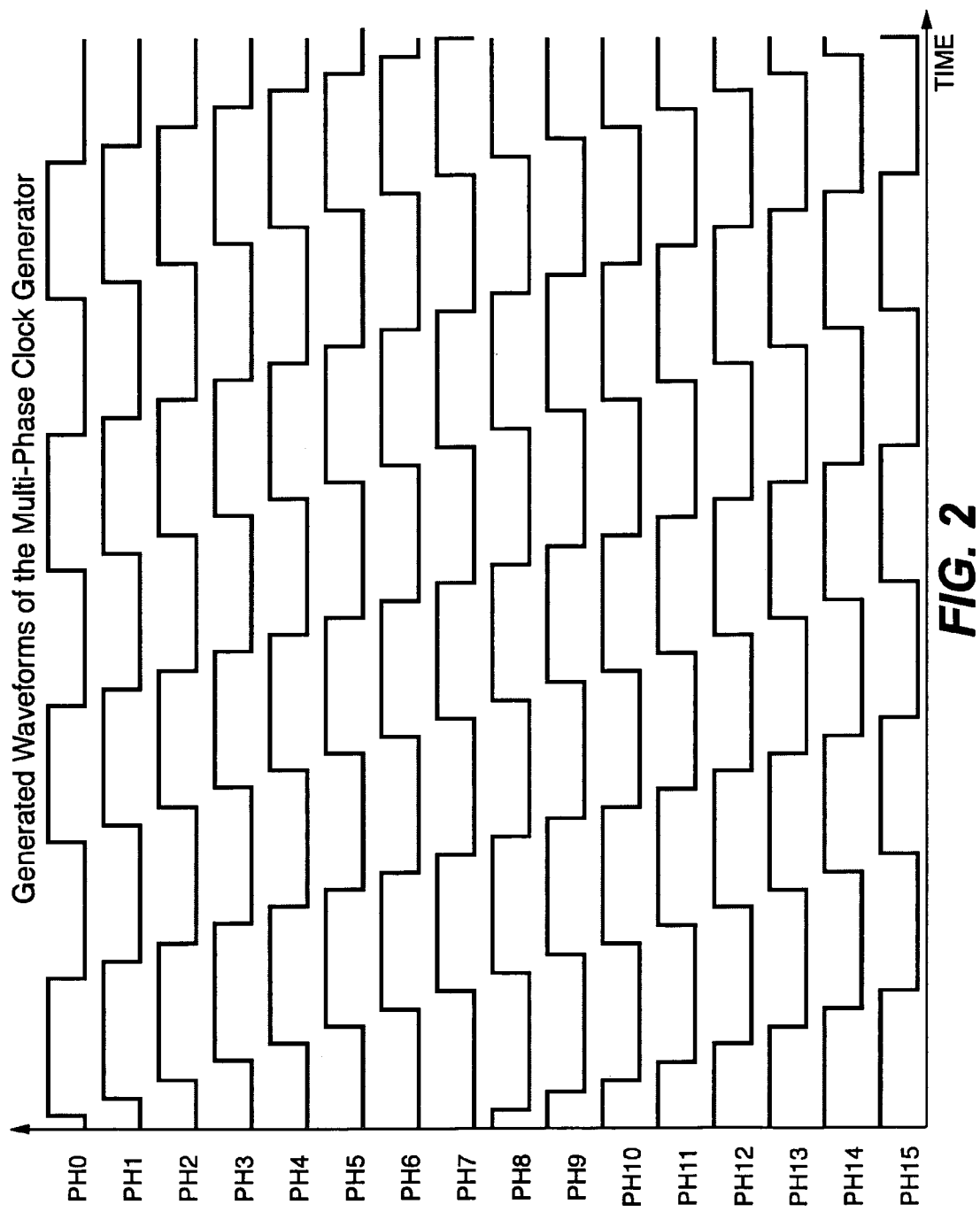
FIG. 2 is a waveform diagram illustrating the waveforms produced on phase outputs PH0–PH15 of the generator over time.

Delay line 110 is not coupled in the feedback loop for PLL 150. Rather, the outputs of delay macros 125 define the 16 phase-distributed clock outputs PH0–PH15 of clock generator 100. As phase detector 104 compares the phase of DATA to the phase of DDATA, filter and control logic 106 selectively increments and decrements the main and incremental delay settings of delay macros 124 to advance and retard the phase of DDATA. At the same time, filter and control logic 106 also updates the main and incremental delay settings of delay macros 125. Once PLL 150 has locked DDATA onto the phase of DATA, phase outputs PH0–PH15 of delay line 110 are synchronized with REFCLOCK and are roughly equally distributed in phase over 360 degrees. FIG. 2 is a waveform diagram, which illustrates the waveforms generated on phase outputs PH0–PH15 when PLL 150 is in a locked state.

In general, each phase output PH0–PH15 is located halfway between the next preceding phase output and the next subsequent phase output. In the case of the phase difference between phase output PH15 and phase output PH0, this phase difference may not be exactly equal to the other phase differences since it contains that part of the clock cycle which cannot be absorbed by an increase or decrease in the settings of a single matched delay macro. The range of this phase step is between 0 and 2 increments, because filter and control logic 106 is configured to avoid changing the delay settings until a full-sized increment or decrement is needed, for example.

When filter and control logic 106 passes the main and incremental delay settings to the separate pairs of delay macros 124 and 125, these control signals are resynchronized to the logic in the delay macros. Resynchronization is desired due to the fact that each delay macro operates at its own phase shift from the REFCLOCK or DATA input. These resynchronization stages are not shown in FIG. 1, but can be employed at each phase quadrant in the circuit, for example. In one embodiment, resynchronization registers are placed (counting from phases 0 to 15) in control bus 140 between the delay macros for phases 3 and 4, between the delay macros for phases 7 and 8, and between the delay macros for phases 11 and 12. Delay macros 124 and 125 in phases 0–3 receive control signals that are registered using a clock signal that is shifted zero degrees from REFCLOCK. Delay macros 124 and 125 in phases 4–7 receive control signals that are registered using a clock signal that is shifted 90 degrees from REFCLOCK. Delay macros 124 and 125 in phases 8–11 receive control signals that are registered using a clock signal that is shifted 180 degrees from REFCLOCK. Delay macros 124 and 125 in phases 12–15 receive control signals that are registered using a clock signal that is shifted 270 degrees from REFCLOCK. Without these resynchronization stages, the control signal edges can collide with the propagated REFCLOCK and DATA signals causing metastability and thus undefined conditions within the delay lines and control logic.

Figure 3:
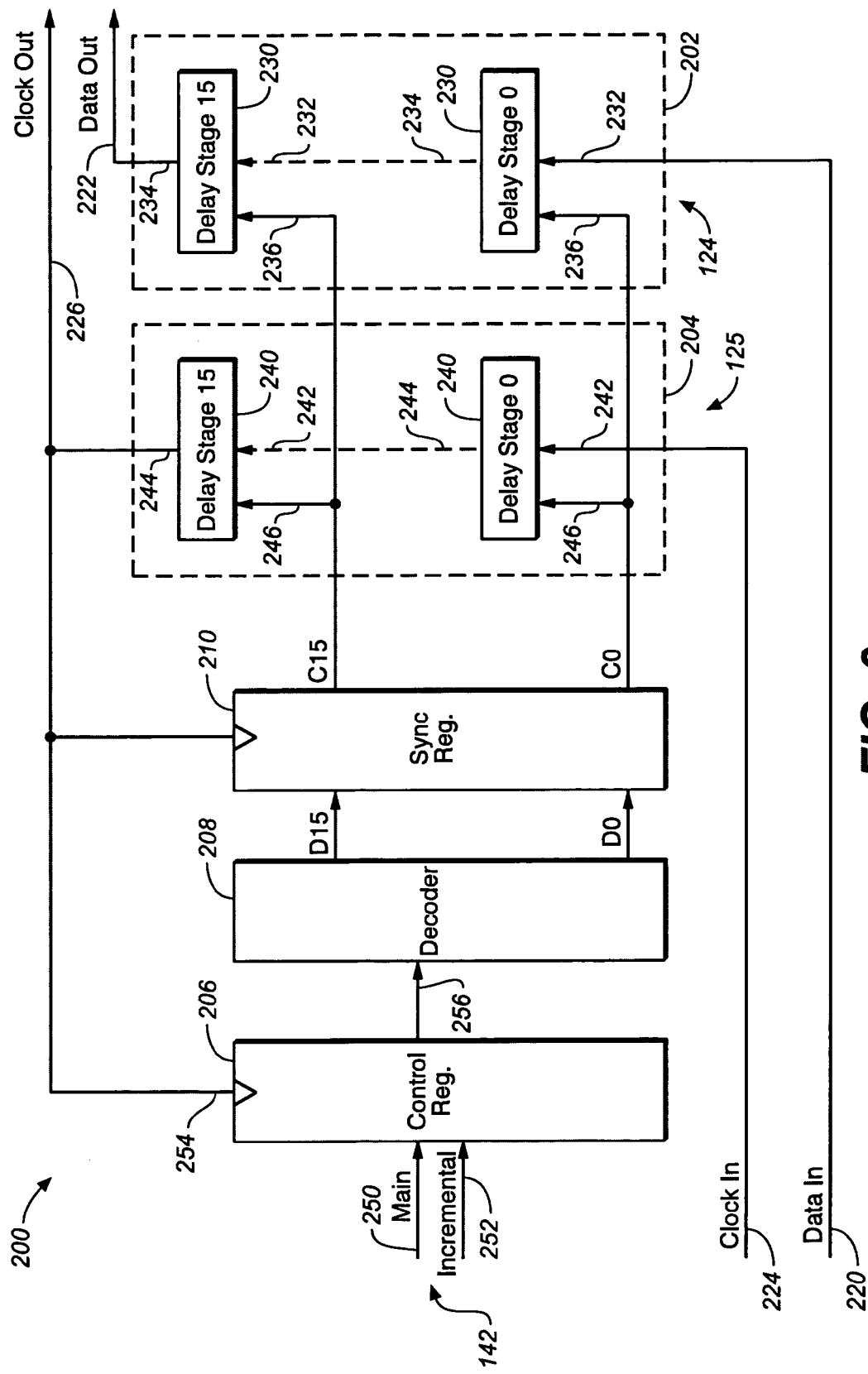
FIG. 3 is a block diagram illustrating one pair of matched delay macros within the generator in greater detail according to one embodiment if the present invention.

FIG. 3 is a block diagram illustrating one pair 200 of matched delay macros 124 and 125 in greater detail. Delay macro 124 includes a programmable delay line 202, and delay macro 125 includes a programmable delay line 204. Delay macros 124 and 125 share common control logic, which includes control register 206, decoder 208 and synchronizing register 210. Delay line 202 has an input 220 (labeled "Data In") which is coupled to the next preceding delay macro 124 in delay line 108 and an output 222 (labeled "Data Out") which is coupled to the next subsequent delay macro 124 delay line 108. Similarly, delay line 204 has and input 224 (labeled "Clock In") which is coupled to the next preceding delay macro 125 and delay line 110 and has a output 226 (labeled "Clock Out") which is coupled to the next subsequent delay macro 125 in delay line 110.

Delay line 202 has a plurality of delay stages 230 which are connected together in series with one another between input 220 and output 222. Each delay stage 230 has a data input 232, a data output 234 and a control input 236. Each of the delay stages 230 further includes a non-delayed data input (shown in more detail in FIG. 4) which is coupled to the non-delayed data input 220 of that delay macro 124. Based on control input 236, each delay stage 230 passes either the non-delayed data input 220 or the data output 234 received from the previous delay stage 230 in line 202 to data output 234 of that stage.

Similarly, delay line 204 has a plurality of delay stages 240 which are connected together in series with one another between input 224 and output 226. Each of the delay stages 240 is identical to each of the delay stages 230 in delay line 202. Delay stages 240 each include a clock input 242, a non-delayed clock input (similar to the non-delayed data input shown in FIG. 4), a clock output 244 and a control input 246. Delay stages 240 operate in a similar fashion as delay stages 230.

Control register 206 has main delay setting input 250 and an incremental delay setting input 252, which together form control input 142, and a clock input 254 coupled to clock output 226 from delay line 125. As mentioned above, main delay setting input 250 has three bits, and incremental delay setting input 252 has one bit. The main and incremental delay settings are latched in control register 206 at the rising edge of clock output 226. This synchronizes the application of the delay settings for this particular pair of delay macros 200. The latched output of control register 206 is coupled to input 256 of decoder 208. In one embodiment, decoder 208 has 16 decoded outputs D0–D15. There is one decoded output D0–D15 for each corresponding pair of delay stages 230 and 240 in delay lines 202 and 204.

Decoder 208 is known as "thermometer decoder", which converts the four-bit binary value received on input 256 to a binary code on outputs D0–D15, wherein the number of logic "1's" on outputs D0–D15 is a function of the binary value provided to input 250. For example a binary code of "100" on a main delay setting input 250 and a binary zero on incremental delay setting input 252 would have an overall binary value of "4", which would produce a logic "1" on the four decoded outputs D12–D15. The remaining decoded outputs D0–D11 would have a logic "0". If the incremental delay setting on input 252 was a "1" then the overall delay setting would be a "5" and decoder 208 would provide "1's" on outputs D11–D15. The number of outputs D0–D15 that have a "1" determines the number of delay stages 230 and 240 in delay lines 202 and 204 that are connected in series with one another. Other types of decoders can also be used.

Decoded outputs D0–D15 are applied to the inputs of synchronizing register 210, which synchronizes the control information on outputs D0–D15 to the rising edge of clock output 226. Synchronizing register 210 has 16 control outputs labels C0–C15, which are applied to respective control inputs 236 and 246 of delay stages 230 and 240. In delay line 202, the data received on data input 220 is routed through each of the delay stages 230 for which a "1" has been applied to its control input 236. Therefore, if C12–C15 are a "1" and C0–C11 are a "0" then the data received on data input 220 would pass serially through the last four delay stages 230 and would skip the first twelve delay stages in delay line 202. Similarly, the clock signal received on clock input 224 passes serially through the number of delay stages 240 for which a "1" is applied to their control inputs 246. Thus, delay lines 202 and 204 have digitally programmable delays.

Figure 4:
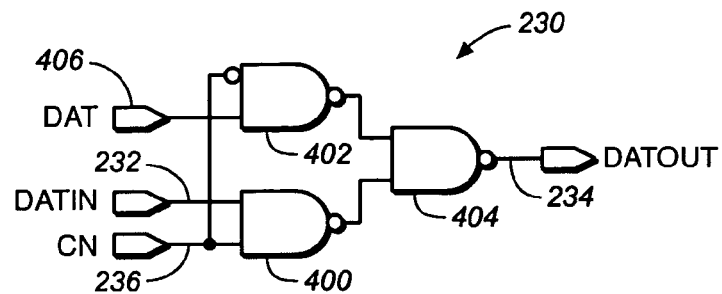
FIG. 4 is a schematic diagram illustrating one of the delay stages used in the matched delay macros shown in FIG. 3 in greater detail according to one embodiment if the present invention.

FIG. 4 is a schematic diagram illustrating one of the delay stages 230 in greater detail. Delay stages 240 have the same structure and operation. Delay stage 230 includes NAND gates 400, 402, and 404. NAND gate 400 has a first input coupled to control input 236 and a second input coupled to data input 232, which is in turn coupled to the data output 234 of the preceding delay stage 230 in delay line 202. NAND gate 402 has a first, inverted input coupled to control input 236 and a second, non-inverted input coupled to a non-delayed data input 406. Non-delayed data input 406 is coupled to the original data input 220 (shown in FIG. 3) to delay line 202. The outputs of NAND gates 400 and 402 are coupled to the inputs of NAND gate 404. The output of NAND gate 404 is coupled to data output 234. When control input 236 is a "0", delay stage 230 passes the original non-delayed data input to data output 234. When control input 236 is a "1", delay stage 230 passes the delayed data input, received from the previous delay stage, to data output 234.

Referring back to FIG. 1, assume that filter and control logic 106 has set the main delay setting to "3" such that each of the delay macros 124 and 125 in delay lines 108 and 110 uses three delay stages (230 and 240 in FIG. 3). When filter and control logic 106 determines from the up/down phase control output 130 that a small increase in delay is required to maintain phase-lock, one pair of matched delay macros 124 and 125 will be increased to use four delay stages. Filter and control logic 106 sets the unique incremental delay setting on the control input 252 of that pair of delay macros 124 and 125 to a "1" to indicate that the delay through that pair of delay macros should be incremented by one delay stage. With each succeeding increase in delay, the delay through a different pair of matched delay macros 124 and 125 is increased to use four delay stages until all sixteen pairs of delay macros 124 and 125 are using four stages. At this point in time, filter and control logic 106 increases the main delay setting on output 140 to require four delay stages and resets all of the unique incremental delay settings.

The order in which the pairs of matched delay macros 124 and 125 are increased is a predetermined order, such as a psuedo-random order. This spreads-out the increase in delay over each of the delay lines 108 and 110 rather than simply starting with the first delay macro in the line and proceeding towards the last delay macro in the line. For example if the first delay macro is labeled "0" and the last delay macro is labeled "15", the order in which the delay is increased could be 7, 3,11,1,9,15,13,5,9,15,2,8,12,4,10,14,6,0. Any other order can also be used, including a sequential order from 0 to 15 or from 15 to 0. The same procedure is implemented in reverse to decrease the cycle time if needed.

Figure 5:
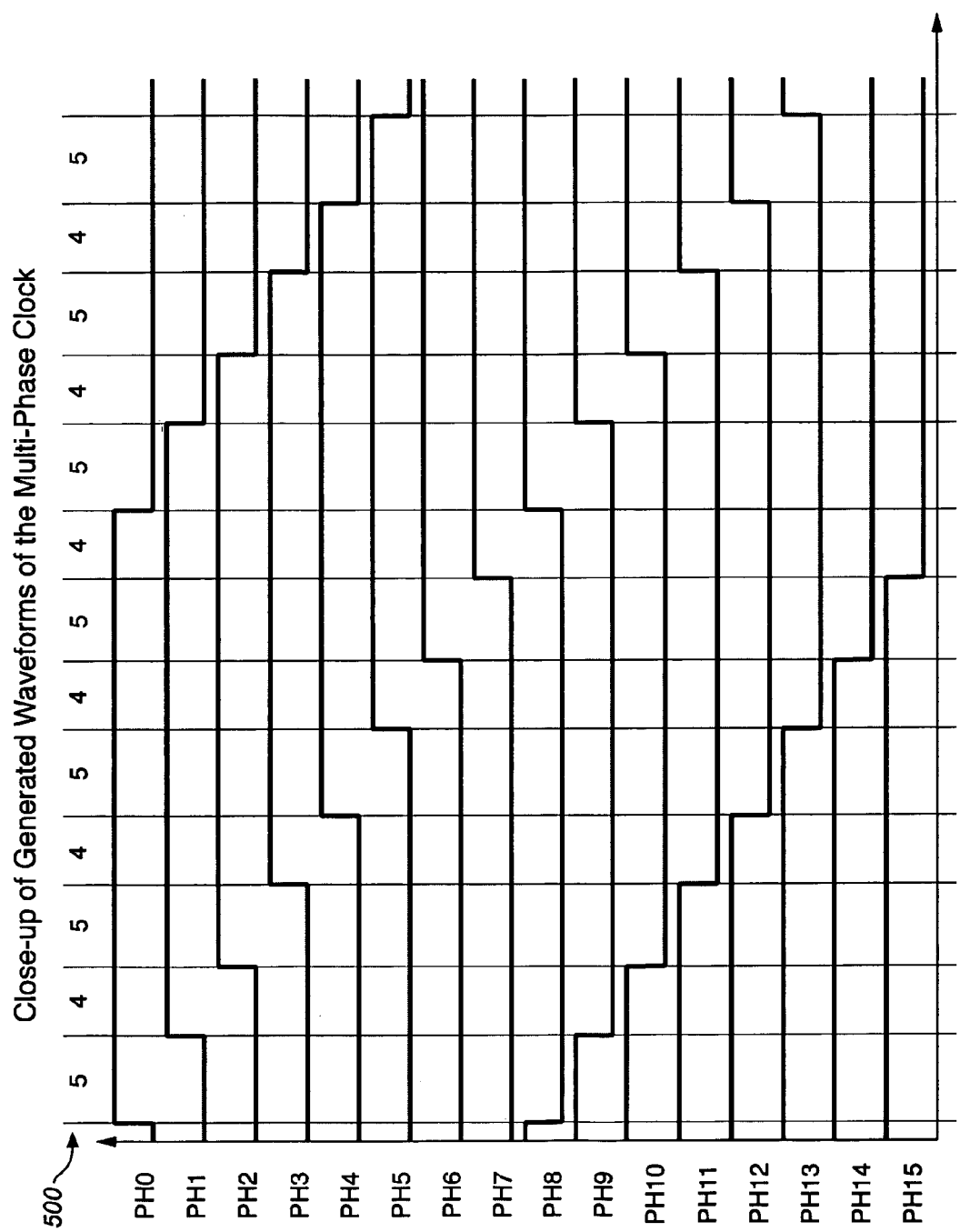
FIG. 5 is a waveform diagram illustrating the waveforms produced on phase outputs PH0–PH15 with an intermediate state of the main and incremental delay settings.

FIG. 5 is a waveform diagram illustrating the waveforms generated on phase outputs PH0–PH15 with an intermediate state of the main and incremental delay settings. As indicated by the numerals in row 500, the delay macros 125 that generate phase outputs PH1, PH3, PH5, PH7, PH9, PH11, PH13 and PH15 are set to use five delay stages 240 (shown in FIG. 3). The delay macros 125 that generate phase outputs PH0, PH2, PH4, PH6, PH8, PH10, PH12 and PH14 are set to use four delay stages 240. The difference in delay can be seen, for example, between the rising edges of PH1 and PH2, which is smaller than the delay between the rising edges of PH2 and PH3.

In order to remain as close to an ideal equal distant phase distribution among phase outputs PH0–PH15, the increments or decrements in delay are spread over the length of the entire delay line 110 as shown by the example in FIG. 5. This way, the average phase difference from one phase to its adjacent phases is as similar as possible for all sixteen phases.

Figure 6:
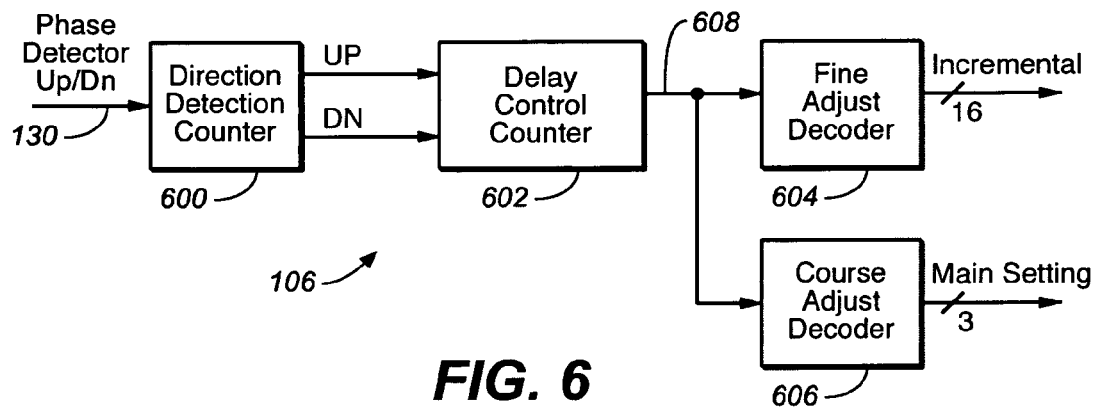
FIG. 6 is a block diagram which illustrates a filter and control logic circuit in greater detail according to one embodiment if the present invention.

FIG. 6 is a block diagram which illustrates filter and control logic 106 in greater detail according to one embodiment if the present invention. Logic 106 includes direction detection counter 600, delay control counter 602, fine adjust decoder 604 and coarse adjust decoder 606. Phase control output 130 from phase detector 104 is coupled to the input of direction detection counter 600. Direction detection counter 600 has up and down counter control outputs UP and DN which are coupled to the count direction inputs of delay control counter 602. Delay control counter 602 has a count output 608 which is decoded by fine and coarse decoders 604 and 606. Decoders 604 and 606 generate the incremental and main delay setting values on outputs 610 and 612, respectively, which form the delay control bus 140 shown in FIG. 1.

Phase control output 130 controls whether direction detection counter 600 counts up or down. Since phase control output 130 can only be either "1" or "0", counter 600 counts up or down at each clock edge. Counter 600 is initialized to an intermediate value and counts up or down to preset limits. In the simplest case, counter 600 counts up or down until it overflows or underflows. Counter 600 detects the overflow or underflow condition and responsively generates an up or a down control signal on output UP or DN causing the count in delay control counter 602 to increment or decrement. The use of direction detection counter 600 as a pre-scaler inhibits a constant count-up, count-down behavior in delay control counter 602. If PLL 150 is in a "locked" state, phase detector 104 will constantly supply UP control signals followed by DOWN control signals, which are averaged by direction detection counter 600.

As delay control counter 602 increments or decrements its count, the count value is decoded by decoders 604 and 606 into a main delay setting and a set of incremental delay settings. These settings are applied to each pair of matched delay macros to increase or decrease the total delay through delay lines 108 and 110 (shown in FIG. 1).

Figure 7:
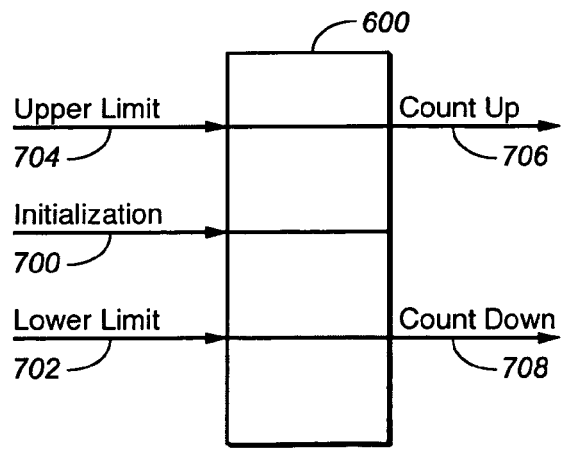
FIG. 7 schematically illustrates a direction detection counter in greater detail according to one embodiment of the present invention.

FIG. 7 schematically illustrates direction detection counter 600 in greater detail. The count in counter 600 has an initial state 700, a preset upper limit 702 and a preset lower limit 704. In one embodiment, counter 600 is a 4-bit counter, which is initialized to state "8" and has an upper limit of "12" and a lower limit of "4". When several UP requests are applied from phase detector 104, counter 600 increments up to state 12, where upper limit 704 limit has been set. This state triggers an "UP" counter control output 706, which increments delay control counter 602 (shown in FIG. 6). This causes the total delay through delay lines 108 and 110 (shown in FIG. 1) to increase. At a point where the delay is almost exactly correct, this latest increment could cause phase detector 104 to produce DOWN requests during the next period of operation. Direction detection counter 600 is reset to its initialization state 700 when delay control counter 602 has been updated. Similarly, when counter 600 reaches its lower limit "4", counter 600 generates a "DN" control output 708 to delay control counter 602, which decrements the delay control counter.

In this example, the lower and upper limits 702 and 704 limits were set at values less than the full scale values of direction detection counter 600 to avoid possible overflow conditions which could cause delay control counter 602 to change state in the wrong direction. The details of the filter and control logic 106 shown in FIGS. 6 and 7 are provides as examples only. Various other control circuits could also be used, which could perform the same or different control functions.

The digital multi-phase clock generator of the present invention permits dynamic adaptation to changes in the frequency of REFCLOCK and changes in process, voltage and temperature. Since the phase-locked loop within the generator is digital, phase lock is retained even if the incoming clock signal, REFCLOCK, stops. Filter and control logic 106 retains its count and control settings such that the same settings can be used again once REFCLOCK is reinstated. Since the clock generator is purely digital and contains no analog circuitry such as an analog charge pump, loop filter and voltage-controlled oscillator as in a traditional analog generator, the generator is very easy to test using standard design verification methodologies. The purely digital clock generator is easy to port to other technologies and is relatively insensitive to changes in process, voltage and temperature.

The digital multi-phase clock generator of the present invention can be converted into a multi-phase oscillator very easy by allowing the output of delay line 110 to be fed back to its input. This kind of oscillator could be used in a variety of data resynchronization applications of the over-sampling type, where the speed of operation is important but not the absolute frequency of sampling. This kind of oscillator could also be used in a variety of other different types of applications.

Although the present invention has been described with reference to preferred embodiments, workers skilled in the art will recognize that changes may be made in form and detail without departing from the spirit and scope of the invention.

What is claimed is:

1. A digital multi-phase clock generator comprising:
   a reference clock input;
   first and second digitally-programmable delay lines coupled in parallel with one another, in series with the reference clock input, wherein each delay line comprises a delay control input and wherein the first delay line comprises a plurality of phase outputs which are synchronized with the reference clock input and have different phases from one another;
   a phase detector and a delay control circuit coupled with second delay line to form a digital phase-locked loop, which locks a phase of an output of the second delay line to a phase of the reference clock input, wherein the delay control circuit has a digital delay control output which is coupled to the delay control inputs of both the first and second delay lines; and
   a frequency divider coupled in series between the reference clock input and the second delay line and between the reference clock input and the phase detector.

2. The digital multi-phase clock generator of claim 1 wherein:
   the first and second delay lines each comprises a plurality of series-connected delay circuits, wherein each delay circuit has a delay input, a delay output and a delay control input, and the delay control input is coupled to the delay control input of a corresponding one of the delay circuits in the other delay line to form a corresponding pair of delay circuits; and
   the delay outputs of the first delay line form the plurality of phase outputs of the generator.

3. The digital multi-phase clock generator of claim 2 wherein:
   the delay control input of each of the delay control circuits in the first and second delay lines comprises a main delay setting input and an incremental delay setting input; and
   the delay control output from the delay control circuit comprises a main delay setting output, which is coupled to the main delay setting input of each of the delay circuits in the first and second delay lines, and a plurality of incremental delay setting outputs, which are each coupled to the incremental delay setting inputs of a respective one of the corresponding pairs of the delay circuits in the first and second delay lines.

4. The digital multi-phase clock generator of claim 3 wherein each corresponding pair of delay circuits comprises:
a shared delay decoder coupled to the main and incremental delay setting inputs of that pair and having a decoded output coupled to control delay through the delay circuits in that pair.

5. The digital multi-phase clock generator of claim 4 wherein each delay circuit in the pair comprises a plurality of series-connected, digitally-programmable delay stages, wherein the propagation delay through the delay stages is controlled by the decoded output.

6. The digital multi-phase clock generator of claim 5 and further comprising
a first register coupled between the main and incremental delay setting inputs and the shared decoder; and
a second register coupled between the decoded output and the plurality of delay stages in the pair of delay circuits.

7. The digital multi-phase clock generator of claim 3 wherein the delay control circuit comprises:
a delay control counter, which is controlled by a phase control output received from the phase detector and has a count output;
a coarse delay adjust decoder coupled between the count output and the main delay setting output; and
a fine delay adjust decoder coupled between the count output and the plurality of incremental delay setting outputs.

8. The digital multi-phase clock generator of claim 7 wherein the coarse and fine delay adjust decoders comprise:
means for setting the main delay setting output to a first value as a function of the count output;
means for incrementing the incremental delay setting output of a different pair of delay circuits in the first and second delay lines with each subsequent increase in the count output; and
means for incrementing the main delay setting output from the first value to a second value and resetting all of the incremental delay setting outputs when all the incremental delay setting outputs have been incremented.

9. The digital multi-phase clock generator of claim 8 wherein the means for incrementing the incremental delay setting outputs comprises means for incrementing the incremental delay setting outputs in a selected order that is different than an order in which the delay circuits are arranged in the first and second delay lines.

10. A method of generating a plurality of multi-phase clock outputs, the method comprising:
a) passing a reference clock through a first digitally-programmable delay line formed of a first plurality of series-connected delay circuits, wherein outputs of the first plurality of delay circuits form the plurality of multi-phase clock outputs;
b) passing a frequency-divided reference clock through a second digitally-programmable delay line formed of a second plurality of series-connected delay circuits, wherein an output of a last one of the delay circuits in the second delay line forms a delay feedback output;
c) detecting a phase difference between a phase of the delay feedback output and a phase of the frequency-divided reference clock; and
d) digitally programming delay through the first and second delay lines as a function of the phase difference; and e) passing the reference clock through a frequency divider to produce the frequency-divided reference clock.

11. The method of claim 10 wherein each of the first plurality of delay circuits has a common delay control input with a corresponding one of the second plurality of delay circuits so as to form a plurality of matched pairs of delay circuits among the first and second delay lines.

12. The method of claim 11 wherein step d) comprises:
d) 1) generating a main delay setting as a function of the phase difference;
d) 2) generating a plurality of incremental main delay settings as a function of the phase difference; and
d) 3) applying the main delay setting to the control inputs of all matched pairs of delay circuits;
d) 4) applying each of the plurality of incremental delay settings to a respective one of the matched pairs of delay circuits; and
d) 5) controlling delay through each pair of delay circuits as a function of the main delay setting and the incremental delay setting that is applied to that pair of delay circuits.

13. The method of claim 12 wherein step d) 5) comprises, for each pair of delay circuits, decoding the main and incremental delay settings with a decoder to generate a decoded output which is applied to control delay through each of the delay circuits within that pair.

14. The method of claim 13 wherein step d) 5) further comprises latching the main and incremental delay settings prior to decoding and latching the decoded output prior to applying the decoded output to the delay circuits within that pair.

15. The method of claim 12 wherein step c) comprises:
c) 1) producing a phase control output as a function of the phase difference;
c) 2) incrementing or decrementing a delay control counter as a function of the phase control output to produce a count output;
c) 3) generating the main delay setting based on the count output; and
c) 4) generating the plurality of incremental delay settings based on the count output.

16. The method of claim 15 wherein steps c) 3 and c) 4) comprise:
setting the main delay setting output to a first value as a function of the count output;
incrementing the incremental delay setting output of a different pair of delay circuits with each subsequent increase in the count output; and
incrementing the main delay setting output from the first value to a second value and resetting all of the incremental delay setting outputs when all the incremental delay setting outputs have been incremented.

17. The method of claim 16 wherein the step of incrementing the incremental delay setting outputs comprises incrementing the incremental delay setting outputs in a selected order that is different than an order in which the delay circuits are arranged in the first and second delay lines.

18. A digital multi-phase clock generator comprising:
a reference clock input;
first and second digitally-programmable delay lines coupled in parallel with one another, in series with the reference clock input, wherein each delay line comprises a plurality of series-connected delay circuits, wherein each delay circuit has a delay input, a delay output and a delay control input, and the delay control input is coupled to the delay control input of a corresponding one of the delay circuits in the other delay line to form a corresponding pair of delay circuits, and wherein the delay outputs of the delay circuits in the first delay line are synchronized with the reference clock input, have different phases from one another, and form a plurality of phase outputs of the generator; and a phase detector and a delay control circuit coupled with second delay line to form a digital phase-locked loop, which locks a phase of an output of the second delay line to a phase of the reference clock input, wherein the delay control circuit has a digital delay control output which is coupled to the delay control inputs of the delay circuits in both the first and second delay lines.

* * * * *